(12) United States Patent
Duello et al.

(10) Patent No.: US 7,035,600 B2
(45) Date of Patent: Apr. 25, 2006

(54) DIGITALLY ADAPTIVE MODULATED TRANSMITTER

(75) Inventors: Wayne Douglas Duello, Hamilton, OH (US); Ky Thoai Luu, Mason, OH (US); Carlos Abascal, Middletown, OH (US); Anders S. Mattsson, Mason, OH (US)

(73) Assignee: Harris Corporation, Melbourne, FL (US)

( * ) Notice: Subject to any disclaimer, the term of this patent is extended or adjusted under 35 U.S.C. 154(b) by 174 days.

(21) Appl. No.: 10/464,961

(22) Filed: Jun. 19, 2003

(65) Prior Publication Data

US 2004/0259509 A1    Dec. 23, 2004

(51) Int. Cl.
*H03C 1/52* (2006.01)
*H04B 1/04* (2006.01)

(52) U.S. Cl. ............... 455/108; 455/114.2; 455/115.1; 375/296; 375/300

(58) Field of Classification Search ............... 455/108, 455/114.2, 114.3, 115.1, 115.2, 115.3, 126, 455/127.1, 127.2, 69, 522; 375/296, 297, 375/300, 301
See application file for complete search history.

(56) References Cited

U.S. PATENT DOCUMENTS

| | | |
|---|---|---|
| 6,285,255 B1 | 9/2001 | Luu et al. |
| 6,449,466 B1 | 9/2002 | Jin et al. |
| 6,489,846 B1 | 12/2002 | Hatsugai |

*Primary Examiner*—Quochien B. Vuong
(74) *Attorney, Agent, or Firm*—Tarolli, Sundheim, Covell & Tummino L.L.P.

(57) ABSTRACT

A circuit for use in a broadcast transmitter for adaptively compensating for carrier signal distortions caused by amplitude modulating an RF carrier signal. The circuit includes a modulator/amplifier network that receives an RF carrier signal and modulates it by a received amplitude varying signal to obtain therefrom a modulated carrier signal which may exhibit distortions caused by the amplitude modulating of the RF carrier signal. A digitally adaptive corrector precorrects the amplitude varying signal prior to application thereof to the network to compensate for any modulated carrier signal distortions. This includes a digital processor that provides signal correction as a function of digital samples representing amplitude variations of the modulated RF carrier signal.

10 Claims, 6 Drawing Sheets

DIGITALLY ADAPTIVE MODULATED TRANSMITTER

BACKGROUND OF THE INVENTION

This invention relates to the art of radio broadcasting and, more particularly, to providing adaptive correction of carrier signal distortions caused by modulating an RF carrier signal.

It is known that amplitude modulating an RF carrier signal with an amplitude varying signal will result in the output carrier signal being shifted in phase and amplitude from that of the input carrier signal by an amount that varies with the magnitude of the amplitude varying signal. Moreover, if a modulator filter is employed additional distortions, sometimes referred to as linear distortions, will take place. These problems become particularly significant when such transmitters are employed for passing modulated carrier signals such as that employed in digital radio carrier signals such as that employed in digital radio signals. These signals may be considered wideband digital signals and are sometimes known as digital in-band on channel (IBOC) digital radio signals, Digital Radio Mondiale (DRM), etc.

Figures 1, 3:
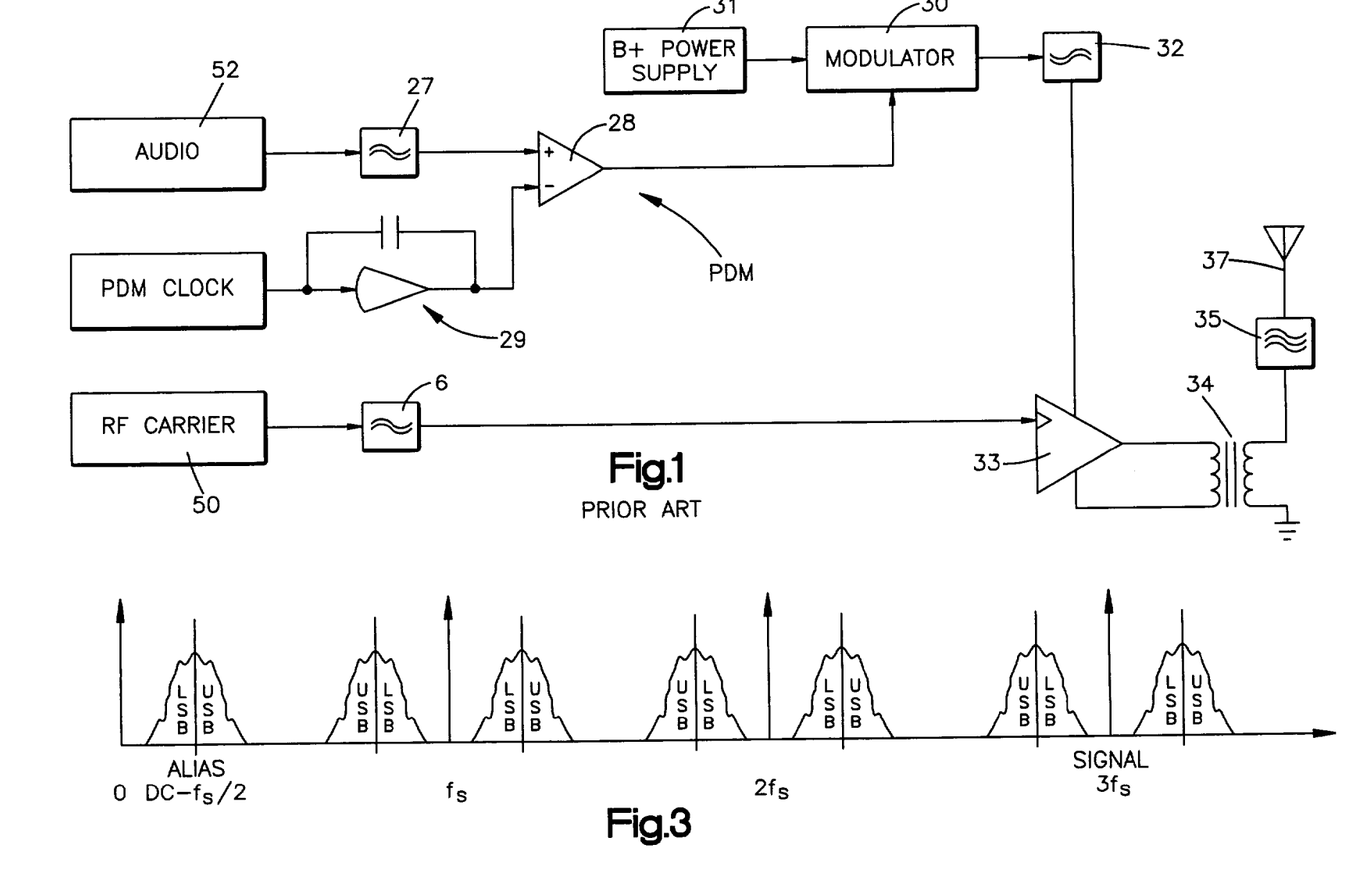
FIG. 1 is a schematic-block diagram illustration of a prior art PDM AM transmitter.
FIG. 3 is a graphical illustration of amplitude with respect of frequency useful in describing the invention herein.

Reference is now made to FIG. 1 which illustrates a prior art pulse duration modulation amplitude modulated transmitter. In this example, an RF signal from an RF carrier signal source 50 is supplied by way of a filter 6 to the input of a power amplifier 33. An audio signal, from an audio source 52 is supplied by way of a filter 27 to a pulse duration modulator circuit PDM. This circuit includes an integrator 29 that provides a sawtooth ramp signal. The integrator provides an output that is supplied to the negative or inverse input of an operational amplifier 28 whereas the positive input thereof receives an output from filter 27. The PDM modulator 30 receives power from a B+ power supply source 31. The modulator output signal is applied by way of a modulator filter 32 to the power amplifier 33. The output of the power amplifier 33 is supplied by way of a transformer 34 through a filter 35 for application to a suitable broadcasting antenna 37.

The prior art PDM AM transmitter disclosed in FIG. 1 is illustrated as an analog circuit. These transmitters are now being employed to transmit digital radio signals, such as those referred to as IBOC signals. Such transmitters may be operated at various power levels, such as at a turn on level at dawn, a higher operating level during daytime, a lower level at dusk (which may be at the same level as that at dawn) and an even lower level during nighttime operation. Such changes in operating power levels result in distortions introduced by the power amplifier 33 as well as the modulator filter 32. This distortion will vary depending on the power levels as well as other causes such as antenna matching, ground conductivity, etc. The distortions caused by the power amplifier 33 result in both phase and amplitude distortions of the modulated carrier signal and these are considered non-linear distortions. The distortions caused by the modulator and the modulator filter may introduce amplitude distortions which are considered as linear distortions.

The present invention is directed toward improvements for compensating or correcting for the distortions introduced in the output carrier signal caused by the amplitude modulation thereof.

SUMMARY OF THE INVENTION

In accordance with one aspect of the present invention, a circuit is provided for use in a transmitter for adaptably compensating for carrier signal distortions caused by modulating an RF carrier signal. The circuit includes a modulator-amplifier network for receiving an RF carrier signal and modulating it by a received amplitude varying signal to obtain therefrom a modulated carrier signal that may exhibit distortions caused by the amplitude modulating of the carrier signal. A digitally adaptive corrector pre-corrects the amplitude varying signal prior to its application to the modulator amplifier network in order to compensate for any modulated carrier signal distortions. This corrector includes a digital processor that provides signal correction as a function of digital samples representing amplitude variations of the modulated RF carrier signal.

In accordance with another aspect of the present invention, the digitally adaptive corrector pre-corrects the modulated carrier signal to compensate for phase distortions that are caused by the amplitude modulation of the RF carrier signal. This corrector includes a digital processor that provides phase correction as a function of digital samples representing variations of the modulated RF carrier signal.

In accordance with a still further aspect of the present invention, it is contemplated that the modulator/amplifier network incorporate a modulator filter that introduces linear distortions into the modulated carrier signal as a result of amplitude modulation thereof. In accordance with this aspect of the present invention, a digitally adaptive corrector implements inverse filter compensation to correct for distortions introduced by the modulator filter.

BRIEF DESCRIPTION OF THE DRAWINGS

The foregoing and other advantages of the present invention will become more readily apparent from the following description as taken in conjunction with the accompanying drawings, wherein.

DESCRIPTION OF A PREFERRED EMBODIMENT

Before describing the preferred embodiment of the invention, reference is first made to the prior art circuit illustrated in FIG. 1. This is illustrated as an analog amplitude modulator that does not provide correction for distortions of the carrier signal caused by amplitude modulation. These distortions are particularly significant when such a transmitter is employed in transmitting wideband digital radio signals. Consequently, correction needs to be employed to minimize these distortions. This is particularly true when the transmitter changes power levels insofar as AM to AM distortions and AM to PM distortions are concerned. The present invention contemplates that adaptive correction be provided for AM to AM operation and for AM to PM operation. Independently of power changes, the invention also contemplates that during digital transmission adaptive correction be performed to correct for distortions caused by the modulator filter.

Figure 2A:
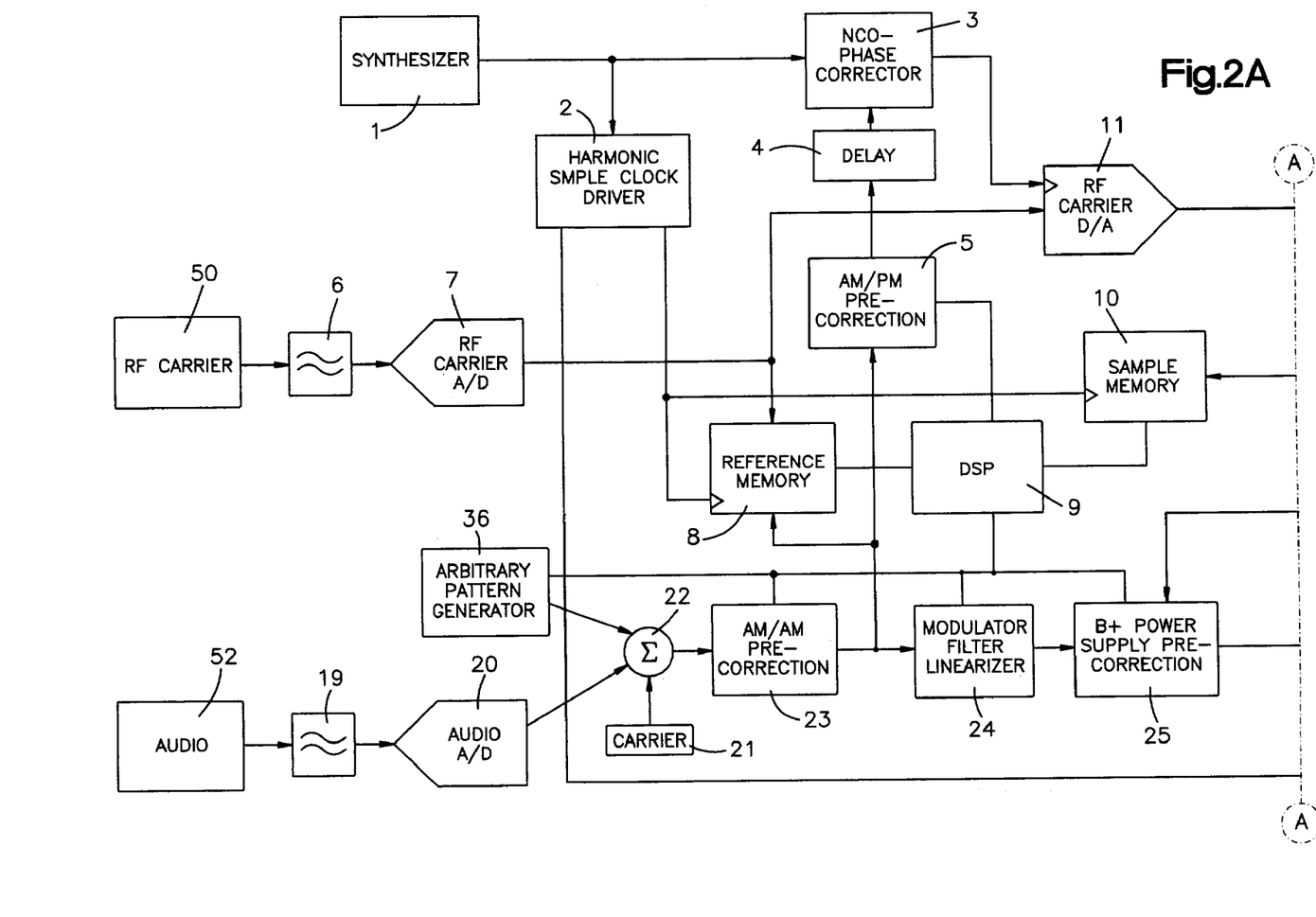
FIG. 2 is a schematic-block diagram illustration of one embodiment of the present invention.
Figure 2B:
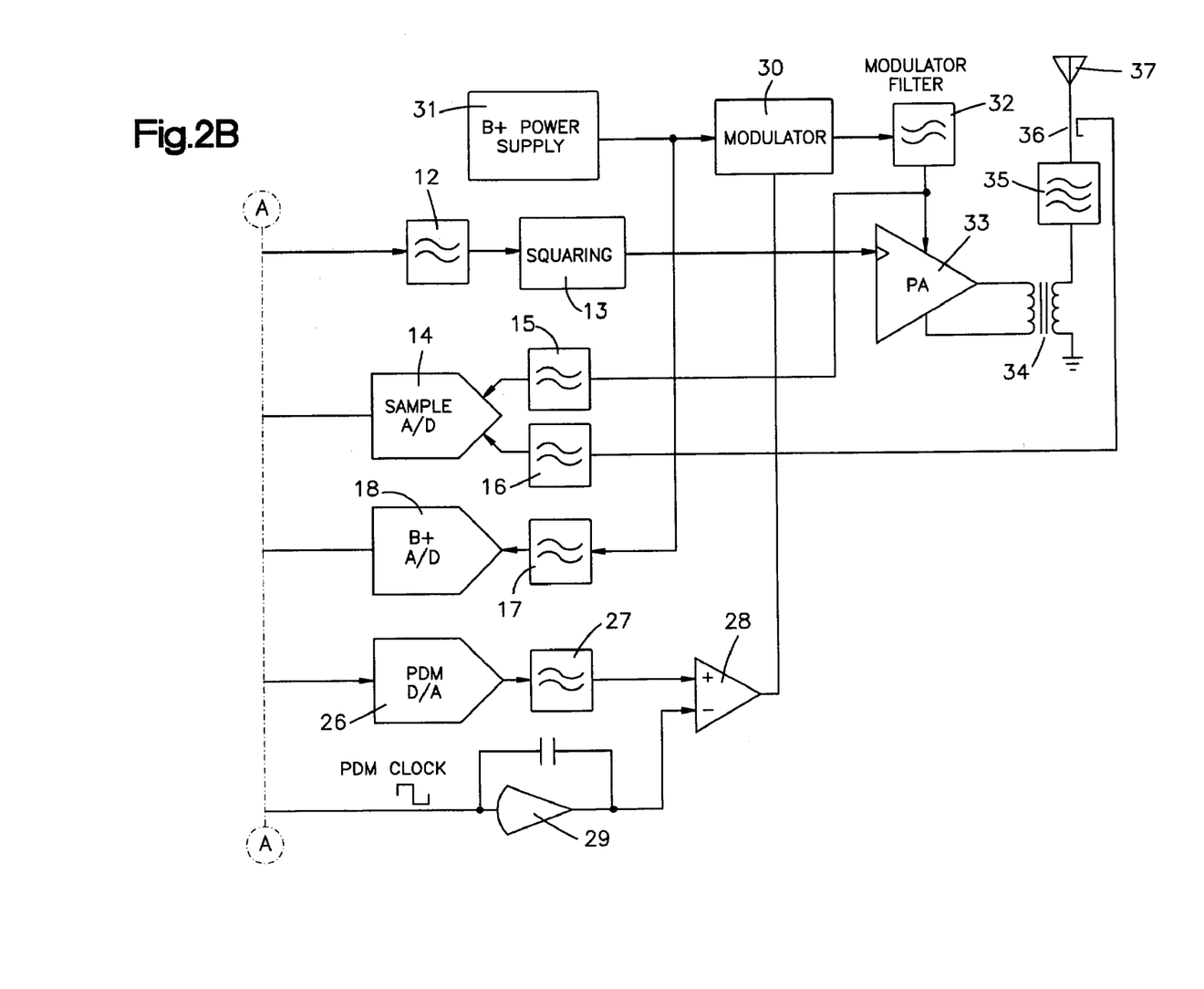

Reference is now made to FIG. 2 which illustrates a schematic-block diagram preferred embodiment of the present invention. The components illustrated in FIG. 2 that correspond with those in FIG. 1 are identified with like character references to simplify the description herein.

It is to be particularly noted that this embodiment employs three adaptive correctors to correct for distortions caused by amplitude modulating the carrier signal. These correctors include modulator filter equalization that includes a modulator filter linearizer, amplitude modulation to amplitude (AM/AM) correction and amplitude modulation to phase modulation (AM/PM) correction.

The modulator filter equalizer to be described in greater detail hereinafter, implements an inverse filter to compensate for amplitude response and group delay of the power amplifier modulator filter. To measure the modulator filter issues, a DSP (digital signal processor) simultaneously collects data sets from the reference and modulator filter sample memories (to be described hereinafter). After time alignment, the DSP calculates the inverse filter to minimize the least mean square error between the input and output filter samples.

The AM/AM pre-corrector compensates for any amplitude distortions in the output signal. These distortions are mainly caused by non-linear characteristics of the modulator, power amplifier, and lossless combiner (all to be described hereinafter). To measure the amplitude distortions, the DSP simultaneously collects data sets from the reference and RF sample memories. After time alignment, the DSP calculates the AM/AM correction polynomials and the inverse.

The AM/PM pre-corrector compensates for the RF carrier phase distortions due to amplitude modulation of the carrier signal. To measure the phase distortion, the DSP simultaneously collects data sets from the reference and RF sample memories. After time alignment, the DSP down converts the RF carrier reference and RF sample data sets to baseband, calculates the phase angles, and calculates the delta between the reference and the sample.

Attention is more specifically directed to the following detailed description with reference to FIG. 2.

A synthesizer 1 serves to provides a stable clock frequency for synthesizing the AM carrier signal as well as the clocks for synchronizing the signal processing. The synthesizer 1 utilizes either an internal or external precision 10 MHz source as the reference. The synthesizer clock output is either 64×, 32×, or 16× the AM carrier frequency.

The harmonic sample clock divider 2 is coupled to the synthesizer 1 and supplies a PDM clock train to the PDM integrator 29 and also supplies samples to the reference memory 8 and the sample memory 10. The adaptive AM/AM and AM/PM signal processing relies on the transmitter output being digitized and the samples are provided to the DSP 9 for offline processing. Traditionally, sampling the output would require the analog to digital converter (A/D) 14 to run at greater than 2 times the highest frequency of interest, or in this case negating modulation, for a 1710 KHz carrier signal at >3420 KHz. Since the signal of interest for the adaptive algorithm is the modulation frequency which is approximately 15 KHz, an undersampling technique can be utilized. In the under-sampled system, the actual signal (in this case 1695 KHz to 1725 KHz) is aliased around the lower sampling frequency and each of the sampling frequency harmonics i.e., $f_s$, $2f_s$, $3f_s$, $4f_s$, . . . An application of this undersampling technique is illustrated in FIG. 3 herein. This illustrates an undersampled AM signal aliased around sampling frequency harmonics. The harmonic sample clock divider 2 implements the divisors from the synthesizer clock to maximize the record length of the data samples while maintaining the appropriate bandwidth to sample the amplitude modulated signal.

AM/PM correction is implemented by adjusting the phase of the input carrier signal obtained from an RF carrier source 50. The RF carrier input signal is filtered by a filter 6 and digitized at a rate of 4× the carrier frequency $f_c$ by an RF carrier A/D 7. The digital samples obtained are supplied to the reference memory 8 for storage thereby and also to an RF carrier D/A 11. The samples at the reference memory 8 are used by the adaptive algorithm in the DSP 9 for off-line processing and calculation of the modulator filter equalizer, the AM/AM transfer function and the AM/PM transfer function. The RF carrier D/A inputs the RF carrier samples and in conjunction with the RF carrier reconstruction filter 12, reconstructs the RF carrier analog signal. The NCO-phase corrector 3 allows phase adjustments of +/−45 degrees of the carrier frequency $f_c$. The phase adjustments are made in relation to the amplitude of the ideal transmitter output signal via an AM/PM pre-correction 5 look up table (LUT). Implementation by other than a LUT could also be accommodated. To ensure alignment of the phase correction with the amplitude present at the transmitter output, a delay 4 is utilized. The delay is necessary to account for filter delays in the audio path that are not present in the RF carrier path.

The RF carrier input signal, whether synthesized or customer driven, is input to a lowpass RF carrier anti-alias filter 6 used to eliminate harmonics of the RF carrier digital signal. This filtering limits the frequency content passed to the RF carrier A/D 7 to the fundamental of the carrier. The RF carrier A/D 7 samples the carrier fundamental at 4× $f_c$ and passes the digital samples to the reference memory 8 and the RF carrier D/A 11.

The reference memory 8 is used to capture the RF carrier and AM/AM pre-corrected samples for processing by the DSP adaptive algorithm. These signals are used as the ideal reference signals and are processed with the sample memory 10 to develop the AM/AM and AM/PM transfer functions of the transmitter. Once the transfer functions have been identified, the inverse function is derived and implemented in the AM/AM pre-corrector 23 and the AM/PM pre-corrector 5.

The digital signal processor 9 performs the adaptive algorithms required to 1) calculate the coefficients for modulator filter equalization; 2) calculate AM/AM correction polynomials; and 3) calculate the AM/PM transfer function and correction LUT.

The direct digital drive power amplifier 33 requires synchronous bridge drive signals to produce the high power output carrier. These bridge drive signals are developed from the reconstructed RF carrier signal. The analog reconstructed RF carrier signal is processed by a squaring circuit which detects the AC coupled zero crossings and transforms the analog signal to digital. The reconstructed RF carrier signal is then processed and sent to the power amplifier 33.

Samples from the modulator filter and RF output are required for the adaptive algorithm to calculate the inverse transfer function necessary to pre-correct the transmitter. The modulator sample, required for modulator filter equalization, is attenuated and sent through the modulator sample anti-alias filter 15 prior to being digitized by the sample A/D 14. The RF output sample, required for AM/AM and AM/PM correction, is attenuated and sent through the RF output anti-alias filter 16 prior to being digitized by the sample A/D 14. Both digital samples are collected by the sample memory 10 to be read by the DSP 9.

Compensation for the B+ power supply 31 requires an accurate sample of the B+ voltage supplied to the modulator 30. The B+ power supply, although DC, has ripple associated with the 60 Hz rectification and loading. The B+ sample feedback is attenuated and sent through the B+ anti-alias filter 17 prior to being digitized by the B+ A/D 18. The digital sample of the B+ voltage is input to the B+ power supply pre-correction 25 where the compensation table is stored in a LUT.

The transmitter input audio signal is low pass filtered by the audio anti-alias filter 19 prior to being digitized by the audio A/D 20. The digital audio samples are then combined with a digital carrier 21 voltage by the audio+carrier adder 22 to produce the audio+DC modulation signal. The Audio+DC signal is then sent to the AM/AM pre-corrector 23.

The Audio+DC input to the AM/AM pre-corrector 23 represents the ideal modulation envelop and carrier. The AM/AM pre-corrector 23 pre-distorts the audio+DC to compensate for non-linear amplitude distortions in the transmitter.

An adaptive finite impulse response (FIR) filter is used in a linearizer 24 to compensate for the amplitude and group delay response of the modulator filter. The modulator filter response is determined by the DSP algorithm by simultaneously capturing the reference memory and modulator filter sample memory and calculating the inverse filter transfer function. The modulator filter linearizer 24 coefficients are written by the DSP once the transfer function is determined.

Compensation for B+ power supply voltage distortion is provided by the B+ power supply pre-correction 25 module. The module multiplies the input by the ideal voltage/B+ sample, i.e., in the case of a +300 Vdc ideal voltage and a +270 Vdc B+ Sample, the multiplier is 1.111. The output of the B+power supply pre-correction module is the digital PDM signal.

The digital PDM signal from the B+ power supply correction is output to the PDM D/A 26 and low pass PDM reconstruction filter 27. The output of the PDM reconstruction filter is the pre-corrected modulation envelop plus carrier voltage. The analog PDM voltage is input to the PDM comparator 28 which produces the digital PDM signal which is subsequently sent to the modulator 30. The PDM integrator 29 is used to integrate the digital PDM clock into a ramp signal.

The modulator 30 is used to produce the high voltage power supply used to drive the power amplifier. The modulator is effectively a switch between the B+ power supply 31 and modulator filter 32. When the PDM signal is active, the switch supplies the B+ voltage to the modulator filter. The modulator filter serves as a reconstruction filter for the digital modulator output.

The B+ power supply 31 is a programmable regulated DC power supply.

The power amplifier 33 produces the high power modulated RF signal to be transmitted.

The combiner 34 illustrated herein as a transformer sums the outputs of the power amplifier 33 modules in the transmitter.

The output filter 35 removes the harmonics and out of band emissions present in the combined RF output.

The RF coupler 36 supplies an RF sample feedback signal to the sample A/D 14. The RF sample is used by the adaptive algorithm for AM/AM and AM/PM correction.

A multiplexer prior to the audio+carrier adder 22 selects either the audio A/D 20 or the arbitrary pattern generator 37 as the input. When the arbitrary pattern generator is selected, the pattern is continuously output and repeated until the generator is disabled. The generator is used as the source for the test tones used to train the AM/AM and AM/PM correctors. Training is performed following transition to the set power after any mute or power-up.

Reference is now made to the flowcharts of FIGS. 4–7 that illustrate the signal processing that takes place within the digital signal processor (DSP) illustrated in FIG. 2. These flow diagrams include a general overall high level control algorithm as presented in FIG. 4, followed by the signal processing routines for the modular filter linearizer in FIG. 5, the AM/AM pre-corrector in FIG. 6 and the AM/PM pre-corrector in FIG. 7.

Figure 4:
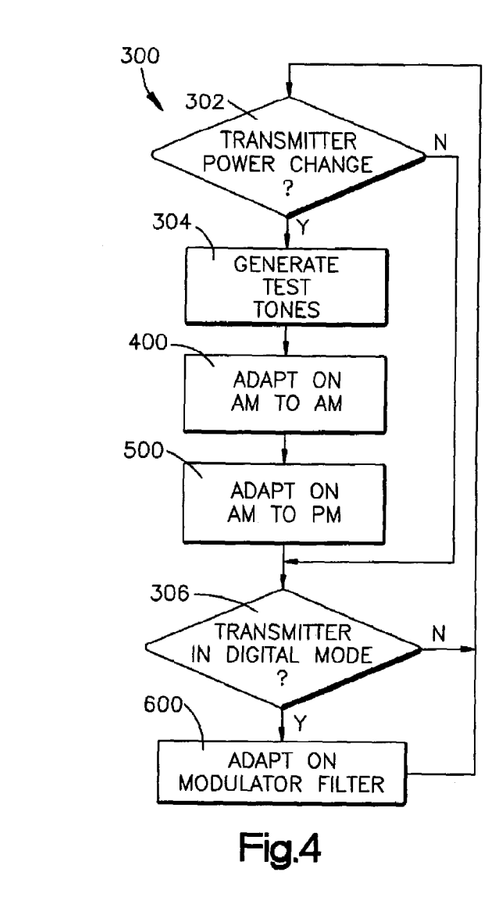
FIG. 4 is a flow diagram of a routine involved in practicing the invention.

Referring specifically to FIG. 4, there is illustrated the high level control algorithm routine 300 in accordance with the present invention. In step 302, a determination is made as to whether the transmitter of FIG. 2 has undergone a power change. It is to be recalled that such a transmitter may have power changes that take place each day, such as a low power level at dawn, a higher power level during the daylight hours, a reduction to the same lower power at dusk and a still lower power during the nighttime. Each time such a power change takes place, this is noted by the procedure in FIG. 4 and procedure advances to step 304 during which test tones are generated by the pattern generator 38 (FIG. 2). This is followed by a routine 400, to be described in greater detail with reference to FIG. 5, during which the adaptive distortion corrections for AM/AM distortion are made. The procedure then advances to step 500 at which an adaptive procedure takes place to provide the corrections for AM/PM distortions as described with reference to FIG. 6.

The procedure advances to step 306 for either a negative decision at the decision step 302 or following the procedure in step 500. In the step 306, a determination is made as to whether the transmitter is operating in a digital mode, such as IBOC. If not, the procedure returns to step 302 awaiting a change in power.

If a determination at step 306 is made that the transmitter is operating in a digital mode, then the procedure advances to step 600 during which an adaptive correction is made correct for distortions resulting from the modulator filter 32 during operation. This procedure is described with reference to FIG. 5. Thereafter, the procedure returns to step 302 to determine whether a transmitter power change has taken place.

Figure 5:
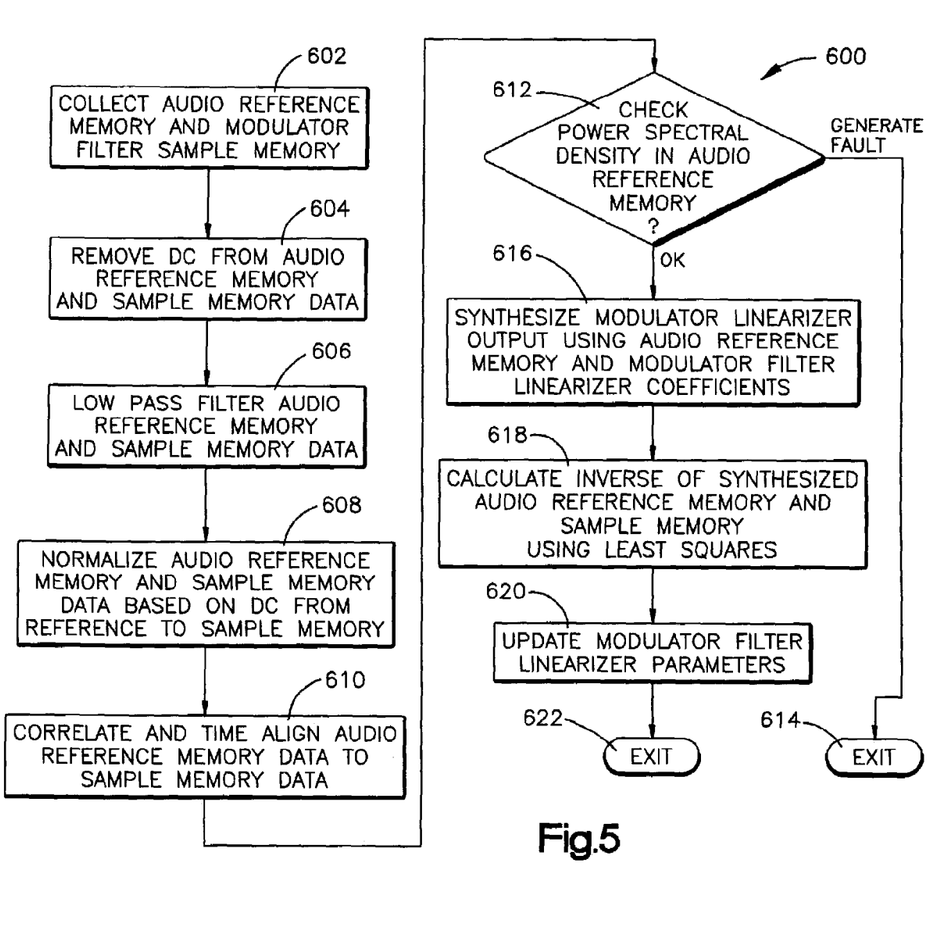
FIG. 5 is a flow diagram illustrating in detail a first routine involved in practicing the invention.

Reference is now made to FIG. 5 which illustrates the routine involved for signal processing in the DSP for modulator filter linearization. This procedure commences with step 602, during which it collects audio samples from the reference memory 8 and modulator filter output samples from the sample memory 10.

The procedure advances to step 604 during which a process removes the DC level from the audio samples obtained from reference memory 8 and the DC level from the samples obtained from the sample memory 10. The procedure advances to step 606.

In step 606, the processor provides a low pass filter that filters the audio samples taken from the reference memory and the samples obtained from the sample memory data and the procedure advances to step 608.

In step 608, the processor normalizes the audio samples taken from the reference memory and the filter samples taken from the sample memory data based on the DC gain from the reference to sample memories. The procedure then advances to step 610.

In step 610, the processor correlates and time aligns the audio data in the reference memory and the data stored in the sample memory. The procedure then advances to step 612.

In step 612, the processor determines whether the power spectral density in the audio reference memory is at a proper level. If not, the processor generates a fault and the procedure exits at step 614. If the determination is okay, that procedure advances to step 616.

In step 616, the processor synthesizes the modulator linearizer output using the audio reference memory and the modulator filter linearizer coefficients. Procedure then advances to step 618.

In step 618, the processor calculates the inverse of the synthesized audio frequency memory and sample memory employing least squares. The procedure then advances to step 620.

In step 620, the processor updates the modulator filter linearizer parameters employed in the adaptive FIR filter provided in the modulator filter linearizer 24. The procedure then exits at step 622.

Figure 6:
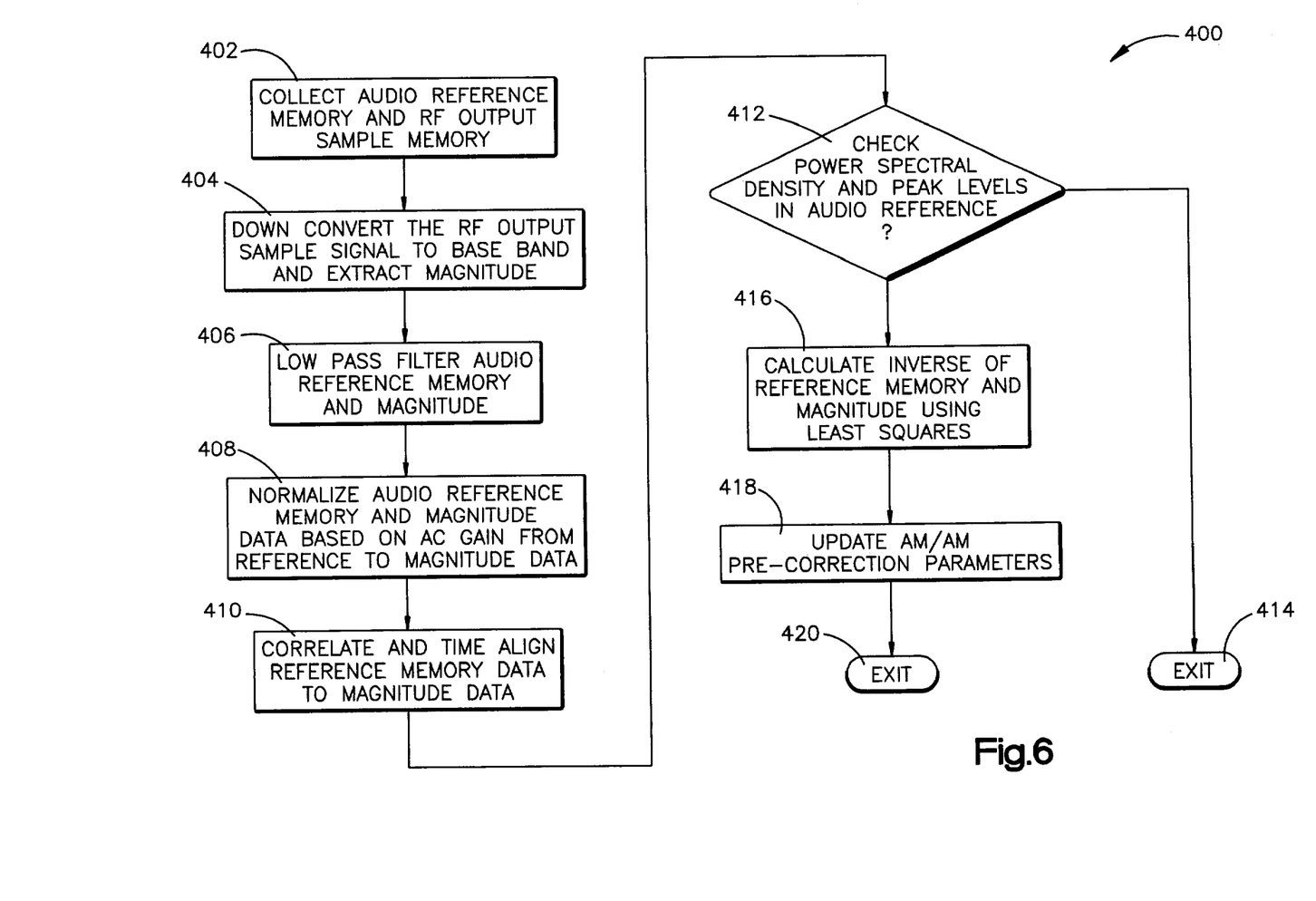
FIG. 6 is a flow diagram illustrating in detail a second routine employed in practicing the invention herein.

Reference is now made to FIG. 6, which illustrates the signal processing that takes place to provide AM/AM pre-correction. Then procedure 400 commences at step 402. In this step, the processor collects audio data from the reference memory 8 and RF output data from the sample memory 10. The procedure then advances to step 404.

In step 404, the processor down converts the RF output sample signal to base band and extracts the magnitude. The procedure then advances to step 406.

In step 406, the processor low pass filters the audio data taken from the reference memory 8 and the extracted magnitude. The procedure then advances to step 408.

In step 408, the processor normalizes the audio data obtained from the reference memory and magnitude data based on the AC gain from the reference to magnitude data. The procedure then advances to step 410.

In step 410 the processor correlates and time aligns the reference memory data to magnitude data. The procedure then advances to the decision step 412.

In the decision step 412, the processor checks the power spectral density and peak levels in the audio data taken from the reference memory to determine if the test tone has enough bandwidth and amplitude variations. If not, a fault is generated and the procedure advances to exit step 414.

If a positive determination was made at step 412, then the procedure advances to step 416. In this step, the processor calculates the inverse of the reference memory and magnitude using least squares. The procedure advances to step 418.

In step 418, the processor updates the AM/AM pre-correction parameters employed in the pre-correction 23 and the procedure exits at step 420.

Figure 7:
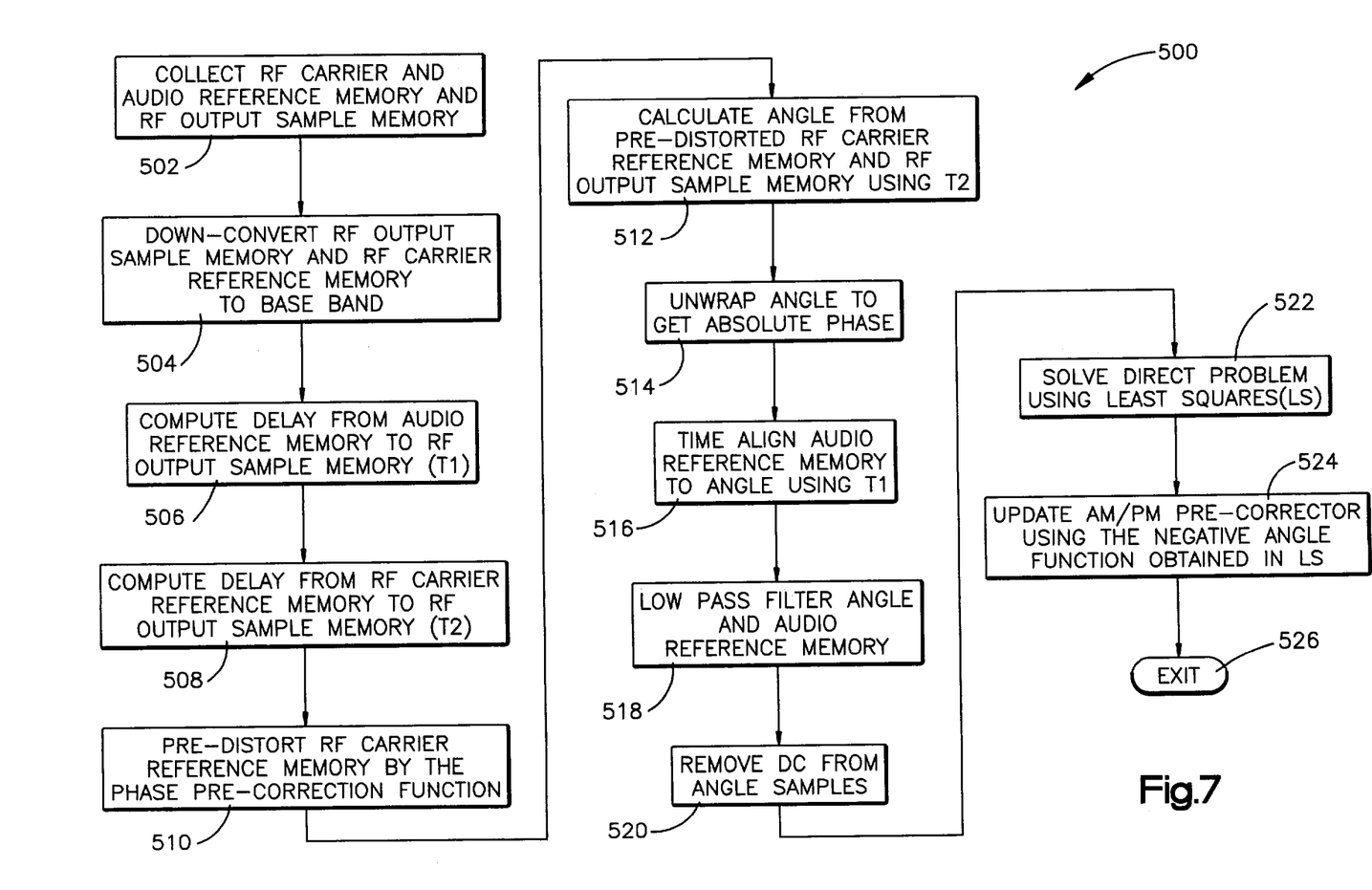
FIG. 7 is a flow diagram illustrating in detail a third routine employed in practicing the invention herein.

Reference is now made to FIG. 7 which is a flow diagram illustrating the signal processing that takes place in conjunction with the AM/PM pre-correction. This routine commences at step 502 during which the processor collects RF carrier and audio data from the reference memory and the RF output sample memory. The procedure then advances to step 504.

In step 504, the processor down converts the RF output from the sample memory and the RF carrier from the reference memory to baseband. The procedure then advances to step 506.

In step 506, the processor computes the delay in the audio data obtained from the reference memory to the RF output data obtained from the sample memory as T1. The procedure then advances to step 508.

In step 508, the processor computes the delay from the RF carrier data obtained from the reference memory to the RF output data obtained from the sample memory as T2. The procedure then advances to step 510.

In step 510, the processor predistorts the RF carrier from the reference memory by the phase pre-correction function that has been determined by the DSP. The procedure then advances to step 512.

In step 512, the processor calculates the angle from the predistorted RF carrier from the reference memory and the RF output from the sample memory using T2. The procedure then advances to step 514.

In step 514, the processor unwraps the angle to get the absolute phase. The procedure then advances to step 516.

In step 516, the processor time aligns the audio from the reference memory to the angle using T1. The procedure then advances to step 518.

In step 518, the processor provides low pass filtering of the angle and the audio reference memory. The procedure then advances to step 520.

In step 520, the processor removes the DC level from the angle samples. The procedure then advances to step 522.

In step 522, the processor solves direct problem using least squares (LS). The procedure then advances to step 524.

In step 524, the processor updates the AM/PM pre-corrector using the negative angle function obtained in LS. The procedure then advances to exit at step 526.

Although the foregoing has been described in conjunction with the preferred embodiment, it is to be appreciated that various modifications may be made without departing from the spirit and scope of the invention as defined by the appended claims.

We claim:

1. A circuit for use in a broadcast transmitter for adaptively compensating for carrier signal distortions caused by amplitude modulating an RF carrier signal comprising:
   a modulator/amplifier network for receiving an RF carrier signal and modulating it by a received amplitude varying signal to obtain therefrom a modulated carrier signal which may exhibit distortions caused by the amplitude modulating of said RF carrier signal;
   a digitally adaptive corrector that precorrects said amplitude varying signal prior to application thereof to said network to compensate for any said modulated carrier signal distortions and including a digital processor that provides signal correction as a function of digital samples representing amplitude variations of said modulated RF carrier signal; and
   wherein said modulator/amplifier network includes a modulator filter that may introduce linear distortions into said modulated carrier signal and wherein said processor provides correction for such linear distortions.

2. A circuit as set forth in claim 1 wherein said circuit includes a phase corrector that adjusts the phase of said carrier signal to compensate for any phase distortions of said carrier signal that may be caused by amplitude modulation thereof.

3. A circuit as set forth in claim 1 including means responsive to said modulated carrier signal for providing said digital samples.

4. A circuit as set forth in claim 3 including a memory for receiving and storing said digital samples.

5. A circuit as set forth in claim 4 including a digital processor that processes said digital samples.

6. A circuit as set forth in claim 1 wherein said circuit includes a DC power supply that provides a DC signal for application to said modulator/amplifier network.

7. A circuit as set forth in claim 6 including a DC supply feedback circuit that provides a DC supply feedback signal dependent on the value of said DC power supply, and a DC power supply corrector that corrects the value of said DC signal as a function of said DC supply feedback signal.

8. A circuit as set forth in claim 7 wherein said modulator/amplifier network includes a modulator filter that may introduce linear distortions into said modulated carrier signal and wherein said processor provides correction for such linear distortions.

9. A circuit as set forth in claim 8 wherein said circuit includes a phase corrector that adjusts the phase of said carrier signal to compensate for any phase distortions of said carrier signal that may be caused by amplitude modulation thereof.

10. A circuit as set forth in claim 9 wherein said modulator/amplifier network includes a modulator filter that may introduce linear distortions into said modulated carrier signal and wherein said processor provides correction for such linear distortions.

* * * * *